(12) United States Patent
Rasiah

(10) Patent No.: US 7,083,850 B2
(45) Date of Patent: Aug. 1, 2006

(54) ELECTRICALLY CONDUCTIVE THERMAL INTERFACE

(75) Inventor: Ignatius J. Rasiah, Singapore (SG)

(73) Assignee: Honeywell International Inc., Morristown, NJ (US)

(*) Notice: Subject to any disclaimer, the term of this patent is extended or adjusted under 35 U.S.C. 154(b) by 0 days.

(21) Appl. No.: 10/483,370

(22) PCT Filed: Oct. 18, 2001

(86) PCT No.: PCT/US01/32544

§ 371 (c)(1),
(2), (4) Date: Jan. 9, 2004

(87) PCT Pub. No.: WO03/041165

PCT Pub. Date: May 15, 2003

(65) Prior Publication Data

US 2004/0191501 A1 Sep. 30, 2004

(51) Int. Cl.
*B32B 15/00* (2006.01)
*H01L 23/26* (2006.01)

(52) U.S. Cl. .................... 428/312.8; 428/323; 428/332; 428/338; 428/457; 438/122; 438/660; 438/661; 427/191; 156/77; 257/706; 257/720

(58) Field of Classification Search ................ 428/457, 428/323, 332, 338, 209, 304.1, 312.8; 438/122, 438/660, 661; 427/191; 156/77; 257/706, 257/720
See application file for complete search history.

(56) References Cited

U.S. PATENT DOCUMENTS

| 4,620,216 | A | 10/1986 | Horvath ........................ 357/81 |
| 5,166,775 | A | 11/1992 | Bartilson ..................... 361/383 |
| 5,522,700 | A | 6/1996 | Hong ........................... 415/177 |
| 5,535,094 | A | 7/1996 | Nelson et al. ................. 31/697 |
| 6,317,023 | B1 * | 11/2001 | Felten ........................ 338/254 |

FOREIGN PATENT DOCUMENTS

| EP | 0816423 | | 1/1998 |
| JP | 63-140292 | | 6/1988 |
| JP | 07/118701 | | 5/1995 |
| JP | 07118701 | A * | 5/1995 |
| JP | 07118706 | A * | 5/1995 |
| JP | 09/162336 | | 6/1997 |
| JP | 11/035914 | | 2/1999 |

* cited by examiner

*Primary Examiner*—Stephen Stein
(74) *Attorney, Agent, or Firm*—Buchalter Nemer; Sandra P. Thompson

(57) ABSTRACT

A porous, flexible, resilient heat transfer material which comprises network of metal flakes. Such heat transfer materials are preferably produced by first forming a conductive paste comprising a volatile organic solvent and conductive metal flakes. The conductive paste is heated to a temperature below the melting point of the metal flakes, thereby evaporating the solvent and sintering the flakes only at their edges. The edges of the flakes are fused to the edges of adjacent flakes such that open pores are defined between at least some of the adjacent flakes, thereby forming a network of metal flakes. This network structure allows the heat transfer material to have a low storage modulus of less than about 10 GPa, while having good electrical resistance properties.

20 Claims, 2 Drawing Sheets

ELECTRICALLY CONDUCTIVE THERMAL INTERFACE

This is a 371 National Stage application of PCT/US01/32544 filed October 18. 2001.

BACKGROUND OF THE INVENTION

1. Field of the Invention

The present invention relates to the manufacture of circuit boards and integrated circuit packages. More particularly, the invention relates to low storage modulus, electrically conductive thermal interfaces for integrated circuit packages.

2. Description of the Related Art

Integrated circuits are well known industrial products, and are used for a wide variety of commercial and consumer electronic applications. They are particularly useful in large scale applications such as in industrial control equipment, as well as in small scale devices such as telephones, radios, and personal computers.

As the desire for more intensive electronic applications increases, so does the demand for electrical systems that operate at faster speeds, occupy less space, and provide more functionality. To meet these demands, manufacturers design electrical and electronic devices containing numerous electrical components residing in relatively close proximity. These components tend to generate large amounts of heat which must be dissipated by some means to avoid failure or malfunction of the device.

Traditionally, electronic components have been cooled using forced or convective circulation of air within the housing of the device. Cooling fans are often provided as an integral part of an electronic device or are separately attached thereto for increasing the surface area of the integrated circuit package which is exposed to air currents. Such fans are employed to increase the volume of air which is circulated within a device's housing. U.S. Pat. No. 5,522,700 teaches the use of a typical fan device for dissipating heat from an electronic component. U.S. Pat. No. 5,166,775 describes an air manifold mounted adjacent to an integrated circuit for directing air jets onto electronic devices mounted to the circuit. The air manifold has an air inlet and a plurality of outlet nozzles positioned along the channel for directing air onto the electronic devices.

Unfortunately, as integrated circuits continue to decrease in size while power densities increase, simple air circulation is often insufficient to adequately cool circuit components. Heat dissipation beyond that which is attainable by air circulation can be achieved by attaching a heat sink or other thermal dissipation device to the electronic component. U.S. Pat. No. 4,620,216 describes a unitary heat sink for a semiconductor package having a plurality of cooling fin elements, which heat sink is used to cool high density integrated circuit modules. U.S. Pat. No. 5,535,094 teaches the combined use of an air blower and a heat sink. It teaches a module which has an integral blower that cools an integrated circuit package. The blower is attached to a heat sink that is mounted to the integrated circuit package. Heat generated by the integrated circuit conducts to the heat sink. The blower generates a stream of air that flows across the heat sink and removes heat from the package.

It is known in the art to use a thermal or electrical interface to attach such thermal dissipation devices to a heat emitting component. However, conventional interfaces have been known to suffer from several disadvantages. Interfaces used in the semiconductor industry typically comprise metal interfaces or polymer adhesives filled with conductive fillers. Metal interfaces such as solder, silver, and gold provide low resistivity, but have a high storage modulus and are not suitable for large IC dice. Furthermore, polymer adhesives can be very low modulus, but their resistivity is too high. As the amount of heat emitted from chips gets higher, there is a need for a thermal interface for use with an integrated circuit package or semiconductor die, which thermal interface has a low modulus as well as high thermal and electrical conductivity. There is also a need for such interfaces to be capable of being assembled and processed at low temperatures, such as about 200° C. or less.

The present invention provides a solution to this problem. According to the invention, a porous, flexible, resilient heat transfer material is formed, which material comprises network of metal flakes. Such heat transfer materials are preferably produced by first forming a conductive paste comprising a volatile organic solvent and conductive metal flakes. The conductive paste is heated to a temperature below the melting point of the metal flakes, thereby evaporating the solvent and sintering the flakes only at their edges. The edges of the flakes are fused to the edges of adjacent flakes such that open pores are defined between at least some of the adjacent flakes, thereby forming a network of metal flakes. This network structure allows the heat transfer material to have a low storage modulus of less than about 10 GPa, while having good electrical resistance properties.

SUMMARY OF THE INVENTION

The invention provides a porous, flexible, resilient heat transfer material which comprises a network of metal flakes, said flakes having edges, which flakes are sintered only at their edges and are fused to the edges of adjacent flakes such that open pores are defined between at least some of the adjacent flakes.

The invention further provides a method for forming a porous, flexible, resilient heat transfer material which comprises:

a) forming a conductive paste comprising a solvent and conductive metal flakes having edges; and b) heating the conductive paste to a temperature below the melting point of the metal flakes, thereby evaporating the solvent and sintering the flakes only at their edges, thus fusing the edges of adjacent flakes such that open pores are defined between at least some of the adjacent flakes, thereby forming a network of metal flakes.

The invention still further provides a method for conducting heat away from a microchip which comprises:

a) forming a conductive paste comprising a solvent and conductive metal flakes having edges;

b) attaching a layer of the conductive paste between a microchip and a heat spreader, thus forming a composite;

d) heating the composite to a temperature below the melting point of the metal flakes, thereby evaporating the solvent and sintering the flakes only at their edges, thus fusing the edges of adjacent flakes such that open pores are defined between at least some of the adjacent flakes, and forming a heat transfer material layer between the microchip and the heat spreader, which heat transfer material comprises a network of metal flakes.

DETAILED DESCRIPTION OF THE PREFERRED EMBODIMENT

Figure 1:
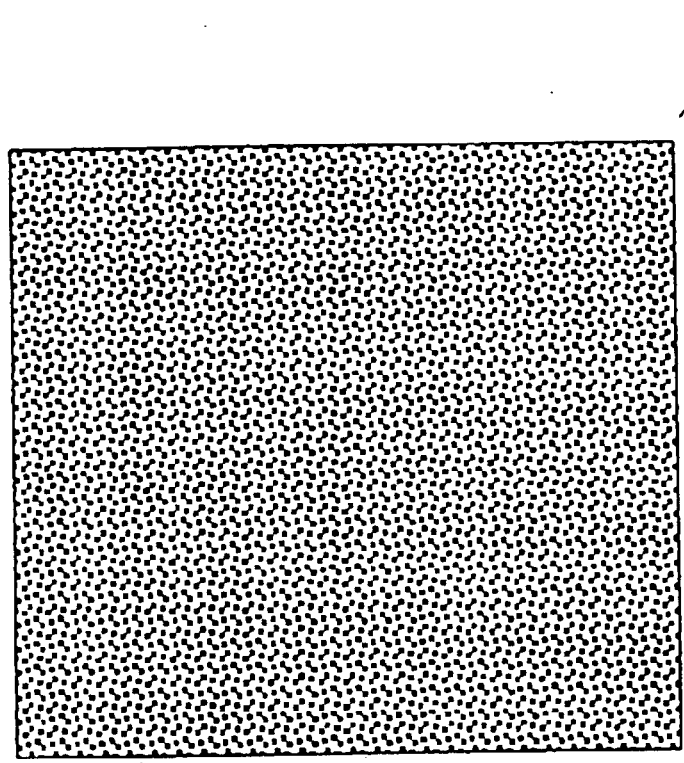
FIG. 1 shows a top view of a layer of heat transfer material of the invention.
Figure 2:
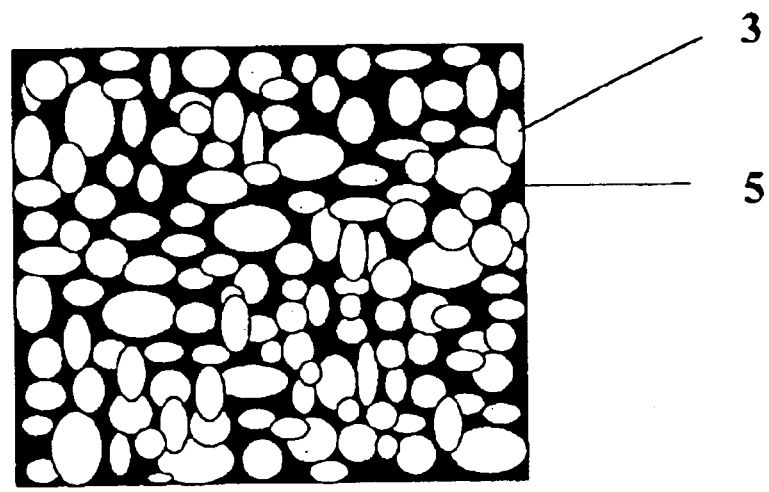
FIG. 2 shows a close-up top view of a layer of heat transfer material of the invention.
Figure 3:
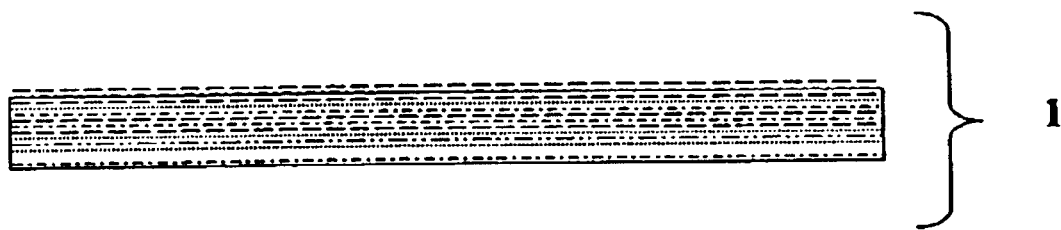
FIG. 3 shows a side view of a layer of heat transfer material of the invention.
Figure 4:
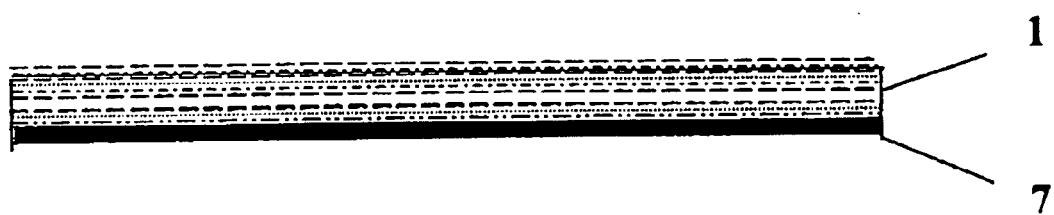
FIG. 4 shows a side view of a layer of heat transfer material of the invention attached to a microchip.
Figure 5:
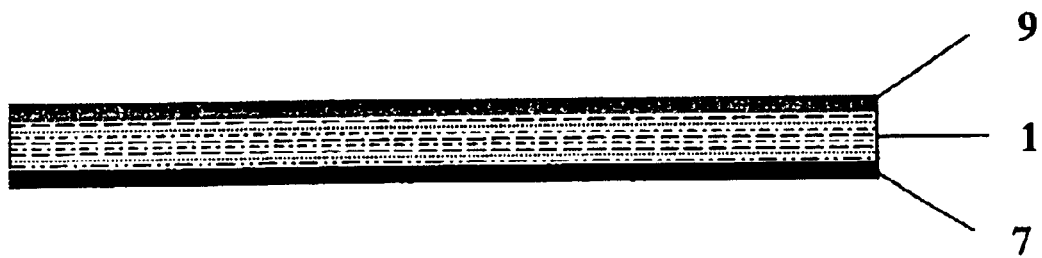
FIG. 5 shows a side view of a layer of heat transfer material of the invention attached to a microchip and a heat spreader.

The invention relates to a porous, flexible, resilient heat transfer material which comprises network of metal flakes. A conductive paste is first formed which comprises a mixture of metal flakes and a solvent. The paste may be formed using any conventional method known in the art such as mixing and the like.

The metal flakes preferably comprise a metal such as aluminum, copper, zinc, tin, gold, palladium, lead and alloys and combinations thereof. Most preferably, the flakes comprise silver. The flakes preferably have a thickness of from about 0.1 µm to about 2 µm, more preferably from about 0.1 µm to about 1 µm, and most preferably from about 0.1 µm to about 3 µm. The flakes preferably have a diameter of from about 3 µm to about 100 µm, more preferably from about 20 µm to about 100 µm, and most preferably from about 50 µm to about 100 µm. In a most preferred embodiment, the each flake has edges which are thinner than the center of the flake.

The solvent preferably serves to lower the melting point of the metal flakes. The solvent preferably comprises a volatile organic solvent having a boiling point of about 200° C. or less. Suitable volatile organic solvents nonexclusively include alcohols, such as ethanol, propanol and butanol. A preferred volatile organic solvent comprises butanol.

The conductive paste is heated such that the solvent evaporates away and the metal flakes are sintered only at their edges. The flakes are thus fused to the edges of adjacent flakes such that open pores are defined between at least some of the adjacent flakes, thereby forming a porous, flexible, resilient heat transfer material which is substantially absent of solvents and binders. Heating of the conductive paste is preferably conducted at a temperature below the melting point of the metal flakes. In a preferred embodiment, the heating is conducted at a temperature ranging from about 100° C. to about 200° C., more preferably from about 150° C. to about 200° C., and most preferably from about 175° C. to about 200° C.

In a preferred embodiment, the heat transfer material is produced in the form of a heat transfer material layer. This is preferably done by applying a layer of conductive paste to a surface of a substantially flat substrate, and heating the conductive paste layer as described above to form a heat transfer material layer. The heat transfer material layer may then optionally be removed from the substrate. Examples of suitable substrates nonexclusively include heat spreaders, silicon die, and heat sinks. A preferred substrate comprises silicon die. The paste may be applied using any known conventional techniques such as by dispensing from a syringe. Preferably, the heat transfer material layer has a thickness of from about 10 µm to about 50 µm, more preferably from about 10 µm to about 35 µm, and most preferably from about 20 µm to about 30 µm. The heat transfer material layer preferably comprises a storage modulus of less than about 10 GPa, more preferably from about 1 GPa to about 5 GPa, and most preferably from about 1 GPa to about 3 GPa. The heat transfer material layer also preferably comprises an electrical resistance of from about $1\times10^{-6}$ ohm/cm to about $1\times10^{-4}$ ohm/cm, more preferably from about $1\times10^{-6}$ ohm/cm to about $5\times10^{-5}$ ohm/cm, and most preferably from about $1\times10^{-6}$ ohm/cm to about $2\times10^{-5}$ ohm/cm.

The heat transfer materials of this invention may be used for various purposes such as a thermal interface between a metal surface and a silicon die, or between heat emitting articles and heat absorbing articles, and the like. In one preferred embodiment, a first surface of the heat transfer material layer is attached to a heat emitting article. Examples of suitable heat emitting articles nonexclusively include microchips, multi-chip modules, laser diodes, and the like. A preferred heat emitting article comprises a microchip. A second surface of the heat transfer material layer may then optionally be attached to a heat absorbing article. Examples of suitable heat absorbing articles nonexclusively include heat spreaders, heat sinks, vapor chambers, heat pipes, and the like. A preferred heat absorbing article comprises a heat spreader. Such heat emitting or heat absorbing articles may be attached to the heat transfer material layer using any suitable conventional method known in the art. In a most preferred embodiment, the heat transfer material layer is formed by first forming a composite which comprises a layer of conductive paste attached between a heat emitting article and a heat absorbing article. The entire composite is then heated to form a heat transfer material between the heat emitting article and the heat absorbing article. The heat transfer materials of the invention are particularly useful in the production of microelectronic devices.

The following non-limiting examples serve to illustrate the invention. It will be appreciated that variations in proportions and alternatives in elements of the components of the invention will be apparent to those skilled in the art and are within the scope of the present invention.

EXAMPLE 1

Silver flakes were mixed with an organic solvent to form a homogeneous paste. At least four pastes were mixed. The ratios of organic solvent to the metal flakes of the pastes are shown in Table 1 below.

TABLE 1

| Ratio of Solvent to Flakes | |
|---|---|
| Lot No. | Ratio of Organics to Flakes |
| 1 | 4 ml solvent to 50 gm Flakes |
| 2 | 4 ml solvent to 50 gm Flakes |
| 3 | 4 ml solvent to 51 gm Flakes |
| 4 | 6 ml solvent to 45 gm Flakes |

The pastes were then filled into syringes, and the viscosity of the pastes were tested using a Haake viscometer with a 1° C. cone and plate. The measurements were done at $22s^{-1}$ and $40s^{-1}$. The viscosity of the different materials prepared is as shown in the Table 2.

TABLE 2

| LOT # | Viscosity at 22 s$^{-1}$ (cps) | Viscosity at 40 s$^{-1}$ (cps) |
|---|---|---|
| 1 | 4093 | 2685 |
| 2 | 3920 | 2476 |
| 3 | 7978 | 5328 |
| 4 | 2256 | 1472 |

As shown in the table, both Lot #1 and Lot #2 had similar viscosities at around 4000 cps. This was expected, since they both have the same mixing ratio of components. Lot #3 and 4, however, had significantly different viscosities which can be correlated to their respective mixing ratio of components.

The materials were then cured with four different cure profiles, as described below in Table 3. Curing was conducted using the following procedure:

1. A minimum of three slides per profile were prepared as follows:
   a. A 1"×3" glass slide was cleaned with isopropyl alcohol and air dried.
   b. A glass slide was placed securely in a glass slide holder.
   c. Using the lines scribed on the holder as a guide, strips of tape were placed 100 mils apart, parallel to the length of the slide. The length of the applied strips was be at least 2.5" long.
   d. There were no wrinkles or air bubbles under the tape.
2. The silver paste was placed on one end of the slide. Using a razor blade maintained at an approximate 30 degree angle to the slide surface, the silver paste material was drawn towards the opposite end of the slide, and the material was squeezed between the tape strips.
3. The tape was carefully removed.
4. The material was cured in an oven.

TABLE 3

Cure Profiles for Paste Formulations

| Cure Profile 1 | Cure Profile 2 | Cure Profile 3 | Cure Profile 4 |
|---|---|---|---|
| Ramp 40° C. to 280° C. in 2 hours | Ramp 40° C. to 200° C. in 2 hours | Ramp 40° C. to 150° C. in 2 hours | Ramp 40° C. to 180° C. in 2 hours |
| Hold at 280° C. for hour | Hold at 200° C. for 1 hour | Hold at 150° C. for 1 hour | Hold at 180° C. for 1 hour |
| Ramp 280 to 40° C. in 1 hour | Ramp 200° C. to 40° C. in 1 hour | Ramp 150° C. to 40° C. in 1 hour | Ramp 180° C. to 40° C. in 1 hour |

The cured materials were then tested for their volume resistivity. Since Lots #1 and 2 had the same mixing ratio of components, Lot #2 was not tested. The volume resistivity was tested using the following procedure:

1. The cross-sectional area (in µm$^2$) of the cured material was measured at three different locations along the tape strips.
2. Resistance measurements were made using a Hewlett-Packard 4-point probe, model number 34401A.
3. The resistance measurements were recorded, and the resistivity was determined using the following formula:

$$P=R\,(A/2.54)\text{ cm}$$

Where:

P=resistivity, ohm.cm

R=measured resistance, ohms

A=cross-section area, cm$^2$ 2.54=distance between inner pair of electrodes, in cm.

Results are shown below in Table 4. It can be observed from the results that the material did not sinter in Profile 3. This is due to the fact that the peak temperature of 150° C. was too low for silver to sinter.

TABLE 4

Volume Resistivity Results for Materials (in Ohm.cm)

| Lot # | Cure Profile 1 | Cure Profile 2 | Cure Profile 3 | Cure Profile 4 |
|---|---|---|---|---|
| 1 | 0.000010 | 0.0000066 | * | Not done |
| 3 | Not done | 0.000016† | Not done | 0.000015† |
| 4 | Not done | 0.000012† | Not done | Not done |

*The sample cured using Profile 3 cannot be measured because the strips cracked when the probes were placed on it. It was observed that the silver flakes did not fuse together and there was a residue on the glass slide when the strips were removed from it. For Profiles 1 and 2, the strips remained intact when removed from glass slide and no residue was seen.
†The values indicated resulted in curing of samples without Clean Dry Air (CDA).

The adhesion strength of the sintered metal flakes to three metal surfaces was tested using a die shear, to determine the bond strength of the silver paste. The test surfaces were formed by coating silver paste onto nickel plated surfaces, silver spot plated surfaces, and bare copper surfaces. The metal surfaces were attached onto lead frames, and cured in an oven.

The cured samples were tested according to the following procedure:

1. A substrate was set in the appropriate holding jig on a die shear tester.
2. A die shear tool tip was aligned against the widest side of the element to be tested. The die shear tool was set as perpendicular to the substrate and as close as possible to the substrate without contracting the substrate surface.
3. The 'TEST' button was pressed on the tester's panel to initiate the shear test cycle.
4. After the shear test cycle was completed, the force level displayed on the panel was recorded.
5. Steps 1 through 4 were repeated until all elements were sheared on that substrate.
6. The average shear strength was calculated for the elements on the substrate.

It was observed from the results that cure profile 1 was too high for the industry while Profile 3 did not sinter the material sufficiently. Profile 3 did not sinter due to the fact that the peak temperature of 150° C. was too low for silver to sinter. Thus, the adhesion measurements were only done for profiles 2 and 4. The paste lot used for this experiment is from Lot #3. The results are as shown in Table 5 below.

TABLE 5

Die Shear Adhesion Results for Lot 3

| | Profile 2 | | | Profile 4 | | |
|---|---|---|---|---|---|---|
| | Heat slug Nickel plated | Leadframe Ag-spot copper | Leadframe Bare copper | Heat slug Nickel plated | Leadframe Ag-spot copper | Leadframe Bare copper |
| 1 | NO ADHESION | 5.2 | 2.4 | NO ADHESION | 1.7 | 0.5 |
| 2 | | 5.8 | 2.5 | | 1.1 | 0.3 |
| 3 | | 4.0 | 1.3 | | 0.9 | 0.1 |
| 4 | | 4.9 | 1.3 | | 1.0 | 0.1 |
| 5 | | 3.6 | 1.5 | | 1.3 | 0.1 |
| 6 | | 5.4 | 1.8 | | 1.0 | 0.2 |
| 7 | | 4.8 | 1.6 | | 1.9 | 0.5 |
| 8 | | 6.0 | 1.8 | | 2.5 | 1.0 |
| 9 | | 4.5 | 1.9 | | 1.5 | 0.7 |
| 10 | | 6.1 | 2.0 | | 2.3 | 0.6 |
| Failure Mode | | Die/paste | Die/paste | | Paste/substrate | Paste/substrate |
| AVG | | 5.0 | 1.8 | | 1.5 | 0.4 |

Adhesion strength were done with 100 × 100 mils die.

As shown in Table 5, the material did not sinter on nickel plated surfaces, while the adhesion on bare copper surface was rather low. Copper oxidizes at elevated temperatures and thus caused a barrier to sintering onto the surface. The silver spot plated surface, however, gave good adhesion at a peak temperature of 200° C. The adhesion was significantly lower at 180° C. Note how the failure mode for Profile 2 is on the die/paste interface while that of Profile 4 was on the paste substrate interface. This shows that the lower cure profile for Profile 4 had less sintering and therefore, failed within the material. The cure at 200° C. for Profile 2 however, had a higher level of sintering. The interface of failure there had been transferred to the die/paste interface where the adhesion to bare silicon was lower.

The adhesion of #4 was then tested using Profile 2. The results are shown in Table 6 below.

TABLE 6

Die Shear Adhesion Results for Lot #4

| | Profile 2 | | |
|---|---|---|---|
| | Heat Nickel | Leadframe Ag-spot | Leadframe Bare |
| 1 | 0.6 | 2.4 | 1.4 |
| 2 | 0.4 | 2.6 | 1.8 |
| 3 | 0.6 | 1.3 | 1.8 |
| 4 | 0.7 | 2.1 | 1.8 |
| 5 | 0.4 | 1.5 | 1.3 |
| 6 | 0.4 | 1.7 | 1.9 |
| 7 | 0.6 | 1.1 | 1.6 |
| 8 | — | 1.9 | 1.1 |
| 9 | — | 1.8 | 2.4 |
| 10 | — | 1.3 | 1.4 |
| Failure Mode | Die/paste | Die/paste | Die/paste |
| AVG | 0.5 | 1.8 | 1.7 |

Adhesion strength were done with 100 × 100 mils die.

As shown in Table 6, the adhesion for the silver spot plated surface was the highest, followed by the bare copper surface. In this experiment, the nickel plated surface showed a minimal amount of adhesion. This particular lot of material, however, showed significantly less adhesion to the silver spot plated surface as compared to Lot #3. This may be due to the higher level of organic solvent within Lot #4.

Analysis and Conclusion

Three varieties of this material were mixed, and the viscosity has been found to be dependent on the mixing ratio of their organic content. All the pastes were able to sinter. Four different profiles for sintering were used. It was found that the silver flakes could sinter at 180° C. or higher. The volume resistivity of the sintered materials was found to be lower than silver filled epoxy adhesives but comparable to the conductivity of silver glass and solder. The adhesion of these pastes was mainly dependent on the temperature. It was also dependent on the surface they adhere to. In particular, a metallized die surface (e.g., with silver) would be a better surface. Apart from the die surface, the material was not able to sinter well onto nickel-plated surfaces but had good adhesion to silver spot plated surfaces.

While the present invention has been particularly shown and described with reference to preferred embodiments, it will be readily appreciated by those of ordinary skill in the art that various changes and modifications may be made without departing from the spirit and scope of the invention. It is intended that the claims be interpreted to cover the disclosed embodiment, those alternatives which have been discussed above and all equivalents thereto.

What is claimed is:

1. A porous, flexible, resilient heat transfer material which comprises a network of metal flakes, said flakes having edges, which flakes are sintered only at their edges and are fused to the edges of adjacent flakes such that open pores are defined between at least some of the adjacent flakes.

2. The heat transfer material of claim 1 which is substantially absent of solvents and binders.

3. The heat transfer material of claim 1 which has a storage modulus of from about 10 GPa or less.

4. The heat transfer material of claim 1 which has an electrical resistance of from about $1 \times 10^{-6}$ ohm/cm to about $1 \times 10^{-4}$ ohm/cm.

5. The heat transfer material of claim 1 wherein the flakes have a thickness of from about 0.1 μm to about 2 μm and a diameter of from about 3 μm to about 100 μm.

6. The heat transfer material of claim 1 wherein the flakes comprise a metal selected from the group consisting of aluminum, copper, lead, zinc, tin, gold, palladium and alloys and combinations thereof.

7. A microelectronic device which comprises a layer of the heat transfer material of claim 1.

8. A microelectronic device which comprises a microchip, a heat spreader on the microchip and a layer of the heat transfer material of claim 1 attached between the microchip and the heat spreader.

9. A method for forming a porous, flexible, resilient heat transfer material which comprises:
   a) forming a conductive paste comprising a solvent and conductive metal flakes having edges; and
   b) heating the conductive paste to a temperature below the melting point of the metal flakes, thereby evaporating the solvent and sintering the flakes only at their edges, thus fusing the edges of adjacent flakes such that open pores are defined between at least some of the adjacent flakes, thereby forming a network of metal flakes.

10. The method of claim 9 further comprising the subsequent step of attaching a layer of the heat transfer material to a microchip.

11. The method of claim 9 further comprising the subsequent step of attaching a layer of the heat transfer material between a microchip and a heat spreader.

12. The method of claim 9 further comprising the subsequent step of attaching the heat transfer material to a microchip, and attaching a second surface of the heat transfer material to a heat spreader.

13. The method claim 9 wherein the flakes comprise a metal selected from the group consisting of aluminum, copper, lead, zinc, tin, gold, palladium and alloys and combinations thereof.

14. The method of claim 9 wherein the flakes comprise silver.

15. The method of claim 9 wherein the flakes have a thickness of from about 0.1 μm to about 2 μm and a diameter of from about 3 μm to about 100 μm.

16. The method of claim 9 wherein the solvent comprises a volatile organic solvent.

17. The method of claim 9 wherein the volatile organic solvent is selected from the group consisting of ethanol, propanol and butanol.

18. The method of claim 9 wherein the volatile organic solvent comprises butanol.

19. The method of claim 9 wherein the flakes are heated at a temperature ranging from about 100° C. to about 200° C.

20. A method for conducting heat away from a microchip which comprises:
   a) forming a conductive paste comprising a solvent and conductive metal flakes having edges;
   b) attaching a layer of the conductive paste between a microchip and a heat spreader, thus forming a composite;
   d) heating the composite to a temperature below the melting point of the metal flakes, thereby evaporating the solvent and sintering the flakes only at their edges, thus fusing the edges of adjacent flakes such that open pores are defined between at least some of the adjacent flakes, and forming a heat transfer material layer between the microchip and the heat spreader, which heat transfer material comprises a network of metal flakes.

* * * * *